(12) United States Patent  (10) Patent No.: US 8,179,519 B2
Stuetzle  (45) Date of Patent: May 15, 2012

(54) ADJUSTING DEVICE WITH A LASER LIGHT SOURCE AND A REFLECTOR FOR ALIGNING A MICROLITHOGRAPHY PROJECTION EXPOSURE INSTALLATION

(75) Inventor: Ralf Stuetzle, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 666 days.

(21) Appl. No.: 12/046,836

(22) Filed: Mar. 12, 2008

(65) Prior Publication Data

US 2008/0309907 A1    Dec. 18, 2008

(30) Foreign Application Priority Data

Mar. 13, 2007 (DE) .................. 10 2007 012 566

(51) Int. Cl.
*G03B 27/68* (2006.01)
(52) U.S. Cl. .......................................... 355/52
(58) Field of Classification Search ............ 355/70, 355/52, 53; 356/399, 400; 378/34
See application file for complete search history.

(56) References Cited

U.S. PATENT DOCUMENTS

| | | | |
|---|---|---|---|
| 6,714,691 B2 * | 3/2004 | Outsuka | 382/294 |
| 7,113,261 B2 | 9/2006 | Dierichs et al. | |
| 2005/0274897 A1 * | 12/2005 | Singer et al. | 250/372 |
| 2006/0209283 A1 * | 9/2006 | Nawata | 355/53 |

FOREIGN PATENT DOCUMENTS

| | | |
|---|---|---|
| EP | 0 987 601 A2 | 3/2000 |
| EP | 1 465 015 A1 | 10/2004 |
| WO | WO 2004/031854 | 4/2004 |

* cited by examiner

*Primary Examiner* — Edward Glick
*Assistant Examiner* — Chia-how Michael Liu
(74) *Attorney, Agent, or Firm* — Fish & Richardson P.C.

(57) ABSTRACT

An adjusting device used to align two components of a microlithography projection exposure installation relative to each other. The adjusting device has an autocollimating device with a light source and a reflector. The light source and the reflector are each rigidly connected to one of the optical components. In one embodiment, the adjusting device has a laser light source which is different from the radiation source. A beam-splitter is downstream from the laser light source and carries useful adjustment light along a first optical path. A reflector can be rigidly connected to a reference component of an illuminating optics system or to a radiation source so that when an actual position of the reference component relative to the radiation source coincides with a desired position, the useful adjustment light is reflected back on itself. A bundle-sensitive component is sensitive to the direction and position of useful adjustment light in the optical path between bundle-sensitive component and reflector. The bundle-sensitive component can be rigidly mounted relative to the radiation source or the reflector. A light sensor is downstream from the beam-splitter in a second optical path for the useful adjustment light which is reflected back by the reflector. This results in an adjusting device which makes it possible to achieve high adjustment accuracy with relatively low construction expense.

21 Claims, 5 Drawing Sheets

ADJUSTING DEVICE WITH A LASER LIGHT SOURCE AND A REFLECTOR FOR ALIGNING A MICROLITHOGRAPHY PROJECTION EXPOSURE INSTALLATION

CROSS-REFERENCE TO RELATED APPLICATION

This application claims benefit of German patent application serial number 10 2007 012 566.8, filed Mar. 13, 2007.

FIELD

The disclosure relates to an adjusting device for aligning at least one optical component of the radiation source of a microlithography projection exposure installation relative to at least one optical reference component of the illuminating optics of the projection exposure installation. The disclosure also relates to an illumination system having such an adjusting device and a projection exposure installation having such an illumination system.

BACKGROUND

Adjusting devices for aligning at least one optical component of the radiation source of a microlithography projection exposure installation relative to at least one optical reference component of the illuminating optics of the projection exposure installation are known. In some instances, such adjusting devices are either structurally complex or need further improvement in terms of their adjustment accuracy.

SUMMARY

In some embodiments, the disclosure provides an adjusting device for aligning at least one optical component of the radiation source of a microlithography projection exposure installation relative to at least one optical reference component of the illuminating optics of the projection exposure installation in a manner that makes it possible to achieve high adjustment accuracy with relatively low construction expense.

In certain embodiments, the disclosure provides an adjusting device for aligning at least one optical component of a microlithography projection exposure installation relative to at least one other optical component of the microlithography projection exposure installation, wherein the adjusting device has an autocollimating device with a light source and a reflector, the light source and the reflector each being rigidly connected to one of the two optical components, and wherein the autocollimating device provides an adjustment accuracy better than 40 μrad.

In some embodiments, the disclosure provides an adjusting device for aligning at least one optical component of a radiation source of a microlithography projection exposure installation relative to at least one optical reference component of an illuminating optics of the projection exposure installation with a laser light source which is different from the radiation source, with a beam-splitter located downstream from the laser light source which lets through useful adjustment light from laser light source along a first optical path, with a reflector which can be rigidly connected to the reference component of one of the group of illuminating optics and radiation source in such a way that when an actual position of reference component relative to the radiation source coincides with a desired position, the useful adjustment light is reflected back on itself, with a bundle-sensitive component which is sensitive to the direction and position of the useful adjustment light in the optical path between the bundle-sensitive component and the reflector and which can be rigidly mounted relative to one of the group of radiation source and reflector, and with a light sensor which is located downstream from the beam-splitter in a second optical path for the useful adjustment light which is reflected back by the reflector.

In certain embodiments (e.g., an autocollimating device for aligning at least one optical component of a microlithography projection exposure installation relative to at least one other optical component of the microlithography projection exposure installation, wherein the adjusting device has an autocollimating device with a light source and a reflector, the light source and the reflector each being rigidly connected to one of the two optical components, and wherein the autocollimating device provides an adjustment accuracy better than 40 μrad), the autocollimating device represents an adjusting device which ensures highly accurate alignment of both optical components. This can be used for demanding adjustment tasks, for example to adjust any facetted mirrors in the projection exposure installation. The two optical components which are to be aligned relative to each other can be components which guide, i.e. deflect or shape, the illumination light of the projection exposure installation. The light source of the autocollimating device can be a laser light source. The reflector of the autocollimating device can be a plane mirror. In addition to the light source and the reflector, the autocollimating device may also have a separate component for paralleling the useful adjustment light from the light source in front of the reflector, for instance one or more lenses. The useful adjustment light from the light source may also be fed in via an optical fiber. In this case, the optical component which is rigidly connected to the light source is rigidly connected to one output end of the optical fiber for the useful adjustment light.

In certain embodiments, the adjustment accuracy of the autocollimating device can be better than 30 μrad (e.g., better than 25 μrad, better than 20 μrad, better than 15 μrad, better than 10 μrad, better than 5 μrad). For example, the adjustment accuracy of the autocollimating device can be 4 μrad. This adjustment accuracy denotes the inclination between the useful adjustment light beam exiting from the light source of the autocollimating device and the useful adjustment light beam reflected by the reflector. This angular accuracy corresponds to the positional accuracy of the alignment of the two optical components which are to be aligned relative to each other.

If a bundle-sensitive component which is sensitive to the direction and position of the useful adjustment light in the optical path between the bundle-sensitive component and the reflector, and which can be rigidly mounted relative to one of the group of radiation source and reflector is used and it is sensitive to both the direction and the position of the useful adjustment light, this results in an adjusting device which ensures precise alignment of the optical components relative to each other. The laser light source and the reflector ensure, through interaction with the bundle-sensitive component, an autocollimation measurement for adjusting the alignment of the optical component of the radiation source relative to the reference component. In principle, a single bundle-sensitive component is sufficient, in most cases, to correctly adjust the main beam path of essential interest of the illuminating radiation, through the illuminating optics of the projection exposure installation. In principle, it can be the case that only the bundle-sensitive component and the reflector need be arranged adjacent to the components which are to be adjusted relative to each other. This is especially advantageous when using the adjusting device in an EUV projection exposure installation because the adjusting device can be formed in such a way that only a few individual components, which additionally involve practically no maintenance, are located inside a vacuum chamber of the projection exposure installation, inside which the installation's radiation source is housed. A vacuum feedthrough for the useful adjustment light can be realized at little construction expense. The light sensor, the bundle-sensitive component and/or the reflector may be part of the feedback control system of the adjusting device. In this case, the bundle-sensitive component and/or the reflector, driven together with the radiation source and/or the reference component, are readjusted depending on the output signal from the light sensor until the signal impinging on the light sensor is equivalent to a setpoint value, within specified tolerance limits. Where the bundle-sensitive component is used, adjustment accuracies can be as discussed above.

In some embodiments, the beam-splitter is configured as a polarizing beam-splitter which is arranged so that the useful adjustment light from the laser light source passes through the beam-splitter along the first optical path for a first polarization component, with a $\lambda/4$ plate in the optical path between the bundle-sensitive component and the reflector, and wherein the light sensor is located downstream from the polarizing beam-splitter in the second optical path for a second polarization component of the useful adjustment light, which component is perpendicular to the first polarization component. This can allow a very high level of decoupling of useful adjustment light into the second optical path. This can increase the sensitivity of the adjusting device.

When an optical fiber is used as the bundle-sensitive component, the optical fiber can be capable of being rigidly mounted on one of the group of radiation source and reference component. This can result in an especially accurate adjusting device. A single mode fiber can be used. The optical fiber can be fitted with known fiber couplers in order to couple light in and out. If an optical fiber is used, any desired vacuum feedthrough for the useful adjustment light can be realized in the region of one of the fiber couplers at little expense. It is sufficient for the fiber coupler which is adjacent to the reflector in the optical path to be rigidly connected to the radiation source or the reference component. This establishes the desired fixed association of the relative positions of the radiation source and the reference component relative first to the bundle-sensitive component and second to the reflector. As an alternative to using an optical fiber as a bundle-sensitive component, a pair of aperture plates can also be used as the bundle-sensitive component, both aperture plates being rigidly connected to the radiation source or the optical reference component. Other bundle-sensitive components, for example other aperture or blade arrangements, are also feasible. Optical wave guides other than optical fibers can also be used as a bundle-sensitive component, even components which, for example, use the critical angle of total reflection or the Brewster angle to detect a specific direction and/or position of the useful adjustment light.

In some embodiments, a $\lambda/4$ plate arrangement is located in the optical path between the reflector side end of the fiber and the reflector and produces the desired effect on the polarization of the useful adjustment light reflected back by the reflector so that this light can impinge at least partially on the light sensor on the way back. A $\lambda/4$ plate arrangement, with its optical axis oriented so that it effectively acts as a $\lambda/2$ plate for the useful adjustment light after the light has passed through the $\lambda/4$ plate twice, can ensure in particular that linearly polarized light is propagated by the fiber. This allows high transmission efficiency during transit through the optical fiber. Instead of the $\lambda/4$ plate, it is possible to use a different optical element which, after double transit, produces at least one polarization component which is perpendicular to the original polarization before the entry into this optical element.

Using a polarization maintaining fiber as an optical fiber produces a further increase in the throughput of useful light and thus in the sensitivity of the adjusting device. Where a polarization maintaining fiber is used, any thermal drifts do not result in undesirable polarization rotation in the fiber.

A photodiode used as light sensor for the adjusting device is inexpensive.

A position sensitive detector that is mounted on the reflector allows precise relative translational positioning of the radiation source with respect to the reference component in two out of three directions in space.

In general, a beam guide parallel to the main beam which is achieved by the reflector on the reference component of one of the group of illumination optics and radiation source being mounted so that useful adjustment light travels at least along one portion through the illumination optics parallel to a desired path of a main beam of the illumination light from the radiation source can be realized at little expense.

A beam guide that is achieved by the reflector on the reference component of one of the group of illuminating optics and radiation source being mounted in such a way that the useful adjustment light travels through an intermediate focus of the desired path of the main beam of illumination light from the radiation source involves no additional through opening for the useful adjustment light in the region of the intermediate focus plane because the useful adjustment light is guided at the location of the illumination light.

In certain embodiments, at least one deflection mirror is present and can be rigidly connected to another component of one of the group of illuminating optics and radiation source so that when the actual position of the reference component of the illuminating optics relative to the radiation source coincides with the desired position, the useful light from the laser light source is reflected back on itself. This can make it possible to adjust a reference component located in the beam path downstream from the illuminating optics. The advantages of an illumination system having an adjusting device as described herein can be equivalent to those explained above in relation to the adjusting device.

Examples of embodiments of the disclosure are explained below, reference being made to the accompanying drawings.

DETAILED DESCRIPTION

Figure 1:
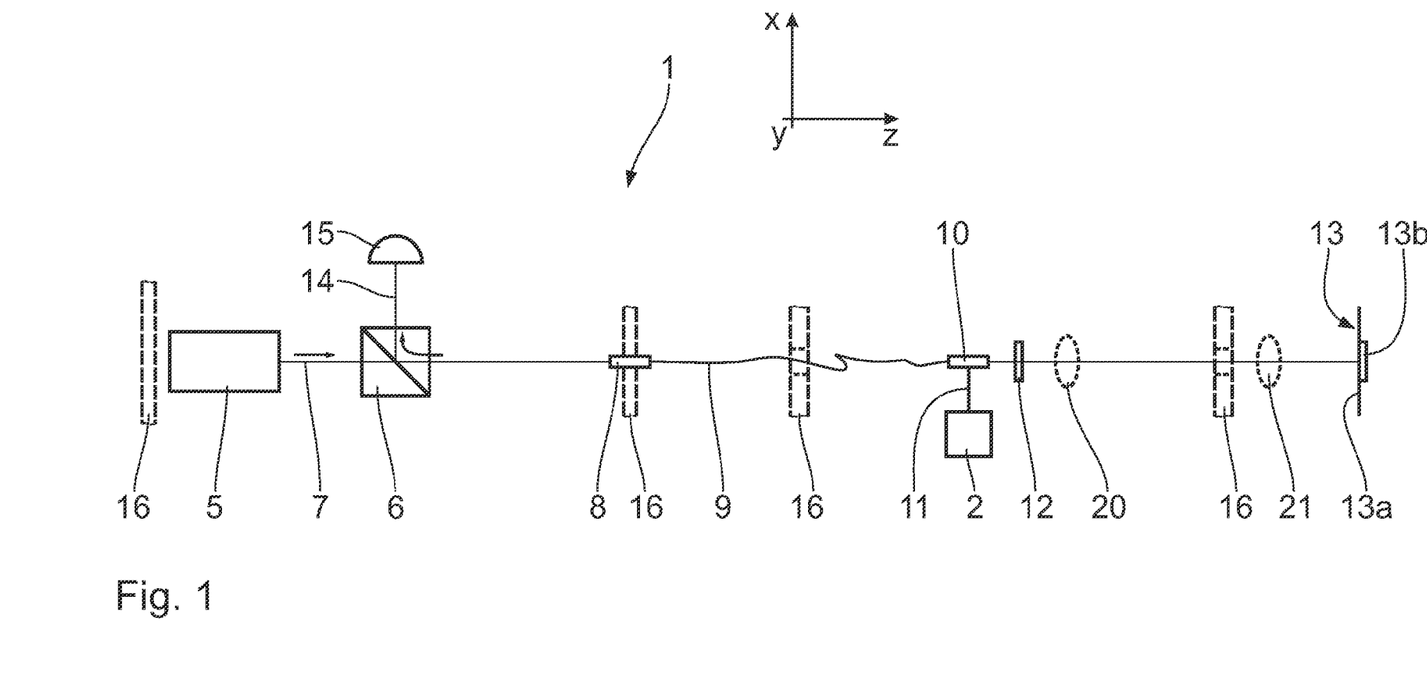
FIG. 1 shows a schematic view of an adjusting device for aligning at least one optical component of a radiation source of a microlithography projection exposure installation relative to an optical component of the illuminating optics of the microlithography projection exposure installation.

An adjusting device referred to in its entirety as 1 in FIG. 1 is used to align at least one optical component of a radiation source 2 of a microlithography projection exposure installation of which, apart from source 2, only a few components of the illuminating optics 3 are shown in the figures, relative to at least one optical component 4 of the illuminating optics 3 of the projection exposure installation. In order to simplify references to positional relationships, an xyz coordinate system is adopted in FIG. 1. In the plane of projection in FIG. 1, the x direction points upwards. The y direction points vertically relative to the plane of projection, towards the viewer, and the z direction in FIG. 1 points to the right.

As well as the actual radiation source which generates EUV radiation, especially in the λ range from 10 to 30 nm, the optical components used to focus the EUV radiation which are assigned directly to the actual source are also part of radiation source 2. These components of the radiation source include, for instance, a collector, for example a nested collector. Optical reference component 4 of illuminating optics 3 which is adjusted relative to at least one optical component of radiation source 2 is, for example, a field facet mirror.

The adjusting device 1 has a laser light source 5 which is different from the radiation source 2. This may be, for instance, a helium neon laser or a laser diode. Useful adjustment light 7 from laser light source 5 passes through polarizing beam-splitter 6, which is downstream from laser light source 5, along a first optical path. In the case described, the beam-splitter 6 is transparent to useful adjustment light 7 polarized transversely in the plane of projection (p-polarized) so that the p-polarized useful adjustment light 7 from beam-splitter 6 is let through without any change in its direction.

After the beam-splitter 6, useful adjustment light 7 enters a first fiber coupler 8 and then a polarization maintaining optical fiber 9. Optical fiber 9 is a single mode glass optical fiber in particular. After passing through optical fiber 9, the useful adjustment light 7 exits this fiber via a further, second fiber coupler 10. The orientation of optical fiber 9 is such that the linear polarization of the useful adjustment light 7, after exiting the second fiber coupler 10, has the same orientation it had before entering the first fiber coupler 8. If, for example, before entering the first fiber coupler 8, the useful adjustment light 7 was p-polarized, it is still p-polarized after exiting the second fiber coupler 10. In cases where the polarization direction of the useful adjustment light 7 does not match a desired polarization direction of the polarization maintaining optical fiber 9, a λ/2 plate which converts the orientation of the polarization direction of the useful adjustment light 7 to the desired polarization direction of optical fiber 9 can be installed in front of the first fiber coupler 8. Fiber coupler 10 is rigidly connected to radiation source 2 via a mechanical holder 11 which is represented schematically in FIG. 1. The second fiber coupler 10 is used as a bundle-sensitive component which is simultaneously sensitive to the direction and the position of the useful adjustment light 7 in the optical path between bundle-sensitive component 10 and field facet mirror 4. Fiber couplers 8 and 10 are each lenses of short focal length which adapt useful adjustment light 7 to the desired or existing optical divergence at the entry to optical fiber 9 or at the exit from optical fiber 9. Such fiber couplers 8 and 10 are familiar to persons skilled in the art.

After exiting the second fiber coupler 10, the useful adjustment light 7 passes through λ/4 plate 12. This plate is tuned to the λ of the useful adjustment light 7 and its optical axis is oriented so that circularly polarized useful adjustment light is generated from the previously p-polarized useful adjustment light 7. After the λ/4 plate, circularly polarized useful adjustment light 7 is incident on a reflector 13, which is rigidly connected to field facet mirror 4. The second fiber coupler 10 is adjusted so that useful adjustment light 7 propagates as a parallel light beam between the second fiber coupler 10 and reflector 13. After the second fiber coupler 10, the useful adjustment light 7 has a diameter of approximately 2 mm. Mirror 13 is not 100% reflective and is partially transparent. Behind a reflection surface 13a of reflector 13, there is a position sensitive detector 13b in the form a quadrant detector, two of its four detection elements being visible in the view shown in FIG. 1.

When radiation source 2 is correctly adjusted with respect to reflector 13, the circularly polarized useful adjustment light 7 impinges on reflector 13 absolutely perpendicularly and is therefore reflected back on itself. Reflected circularly polarized useful adjustment light 7 then passes through λ/4 plate 12 again, and if it was p-polarized when it exited the second fiber coupler 10, it is then s-polarized after this repeat pass. Generally speaking, after passing through the correspondingly oriented λ/4 plate 12 twice, the polarization of useful adjustment light 7 is perpendicular to the polarization of useful adjustment light 7 when it exited the second fiber coupler 10. Thus-polarized, useful adjustment light 7 enters optical fiber 9 again via the second fiber coupler 10 and exits this optical fiber via the first fiber coupler 8. Because of the polarization maintaining effect of optical fiber 9, useful adjustment light 7 is s-polarized when it exits first fiber coupler 8. Because of this, polarizing beam-splitter 6 no longer lets the now s-polarized useful adjustment light 7 through, but reflects it along a second optical path 14 onto a light sensor 15 in the form of a photodiode.

Radiation source 2, together with the illuminating optics 3, is housed in a vacuum chamber. Adjusting device 1 can either be housed entirely in the vacuum chamber or only those components of adjusting device 1 which are adjacent to reflector 13 can be housed in the vacuum chamber. FIG. 1 shows examples of the location of a limiting wall 16 for the vacuum chamber, with standard pressure prevailing to the left of limiting wall 16 and negative pressure prevailing to the right of limiting wall 16 in FIG. 1.

EUV light 17 (cf. FIGS. 2 and 3) is bent by field facet mirror 4 and other reflective components of the illuminating optics 3, for example the component 18 located downstream from field facet mirror 4. The figures schematically show a main beam of the illumination light of EUV radiation 17. EUV light 17 impinges on components 4 and 18 at an angle of incidence exceeding 0°, for example at an angle of incidence in the range from 5° to 20°. Reflector 13 is wedge shaped so that it reflects circularly polarized useful adjustment light 7, which is injected parallel to EUV light 17 before field facet mirror 4, back on itself. A wedge angle α of reflector 13 therefore equals the angle of incidence at which EUV light 17 impinges on field facet mirror 4.

The EUV light 17 has an intermediate focus between radiation source 2 and field facet mirror 4. An intermediate focus aperture 17a (cf. FIG. 3) is arranged at the location of this intermediate focus. A through opening 17b for the circularly polarized useful adjustment light 7 is made in the plane of intermediate focus aperture 17a.

Adjusting device 1 is calibrated so that when useful adjustment light 7 impinges on reflector 13 absolutely perpendicularly and impinges on quadrant detector 13b absolutely centrally, radiation source 2 is correctly aligned with respect to field facet mirror 4 as far as x and y alignment and the tilt of field facet mirror 4 are concerned.

If, during operation of the projection exposure installation, the position of field facet mirror 4 relative to radiation source 2 has changed, for example due to drift effects on radiation source 2, field facet mirror 4 is aligned with radiation source 2 as follows: field facet mirror 4 is moved in the xy plane until circularly polarized useful adjustment light 7 is centrally incident on quadrant detector 13b. The field facet mirror 4 is then tilted around the point where useful adjustment light 7 strikes quadrant detector 13b until the circularly polarized useful adjustment light 7 is reflected back on itself by reflector 13. This is checked by monitoring the signal from light sensor 15. When light sensor 15 indicates a maximum signal, circularly polarized useful adjustment light 7 is vertically incident on reflector 13.

Adjusting device 1 can also be used to set the distance between field facet mirror 4 and source 2 along the z-axis. This is discussed below, taking various embodiments of adjusting device 1 into consideration.

In a first embodiment, laser light source 5 generates pulsed light and the z-axis distance is determined from the time it takes light pulses to travel from laser light source 5 to light sensor 15.

In a second embodiment, a second useful light beam 19 is generated in front of the reflector 13, for example by a second adjustment laser light source 5' (cf. FIG. 3), and propagates at an angle β relative to circularly polarized useful adjustment light 7 and, when field facet mirror 4 is adjusted correctly relative to radiation source 2, impinges centrally on quadrant detector 13b.

Useful light beam 19 is guided so that it passes through intermediate focus aperture 17a. To adjust the z-axis distance between field facet mirror 4 and radiation source 2, field facet mirror 4 is moved along the z-axis until both the circularly polarized useful adjustment light 7 and the useful light beam 19 impinge centrally on quadrant detector 13b. In a further configuration for z-axis adjustment, a divergence critical optical arrangement in the form of two lenses 20 and 21 in a telescopic arrangement is provided in the beam path of useful adjustment light 7 between λ/4 plate 12 and reflector 13. Lens 20 is rigidly connected to second fiber coupler 10 and lens 21 is rigidly connected to reflector 13. Lenses 20, 21 are adjusted so that, when field facet mirror 4 is correctly adjusted relative to radiation source 2, circularly polarized useful adjustment light 7 is also reflected back on itself optimally in terms of the divergence thereof. In this case, the signal from light sensor 15 assumes its maximum value. Where the z-axis distance differs from the z-axis distance which is to be set, the distance between telescopic aperture plates 20 and 21 also differs accordingly. Because of the changed divergence effect of telescopic lenses 20 and 21, the useful adjustment light 7 which is reflected back has a different diameter when it enters the second fiber coupler 10 from when it previously exited the second fiber coupler 10 before being reflected by reflector 13. This causes reduced feedback efficiency of useful adjustment light 7 through optical fiber 9 and hence a weaker signal on light sensor 15.

If it is necessary to dispense with through opening 17b in intermediate focus aperture 17a, the useful adjustment light can also be guided through the plate aperture of intermediate focus aperture 17a for EUV light 17. In doing so, the useful adjustment light can be guided along useful adjustment light beam 19 shown in FIG. 3. In this case, a reflector 13' is used, which is tilted at an angle β relative to reflection surface 13a in order to ensure vertical incidence of the circularly polarized useful adjustment light along useful light beam 19. Useful adjustment light beam 19 passes through intermediate focus aperture 17a at an angle to the main beam of EUV light 17 which at least exceeds the maximum divergence angle of EUV light beam 17 through the intermediate focus at the location of intermediate focus aperture 17a. This ensures that beam guide components for the useful adjustment light guided along useful adjustment light beam 19 do not interfere with EUV light 17 light waveguide components.

If the useful adjustment light is only to be guided through the plate aperture of intermediate focus aperture 17a, z-axis adjustment is carried out using one of the first two z-axis adjustment alternatives stated above.

Optical fiber 9 is an example of an optical component which is bundle-sensitive for both direction and position. Two aperture plates arranged one after the other can be provided, instead of an optical fiber, in adjusting device 1. Both the aperture plates are rigidly connected to radiation source 2. Both aperture plates are adjusted so that useful adjustment light 7 can pass through the aperture plates unimpeded when it is reflected back on itself by reflector 13.

Figure 5:
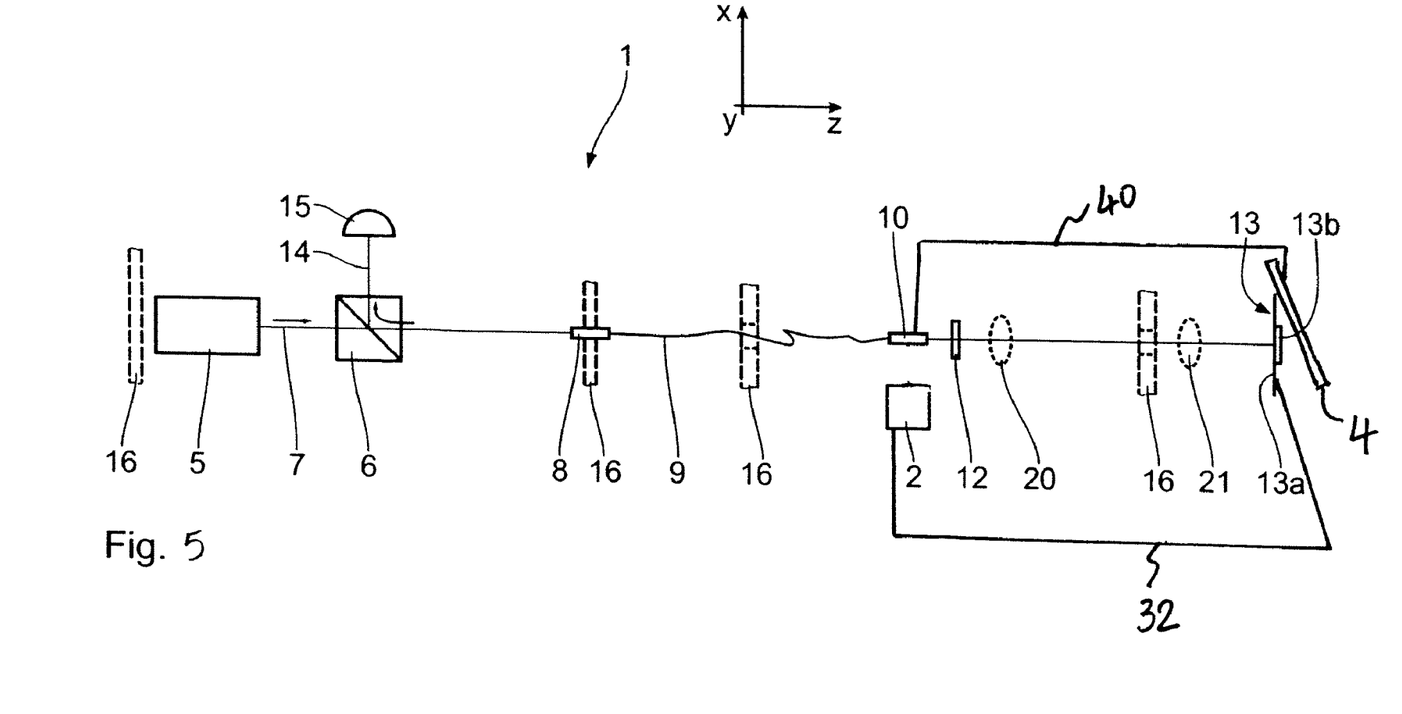
FIG. 5 shows a schematic view of an adjusting device for aligning at least one optical component of a radiation source of a microlithography projection exposure installation relative to an optical component of the illuminating optics of the microlithography projection exposure installation.

Alternatively, as shown in FIG. 5, adjusting device 1 can also be constructed so that the second fiber coupler 10 is rigidly connected to field facet mirror 4 via a holder 40, and reflector 13 is rigidly connected to radiation source 2 via a holder 32.

Figure 6:
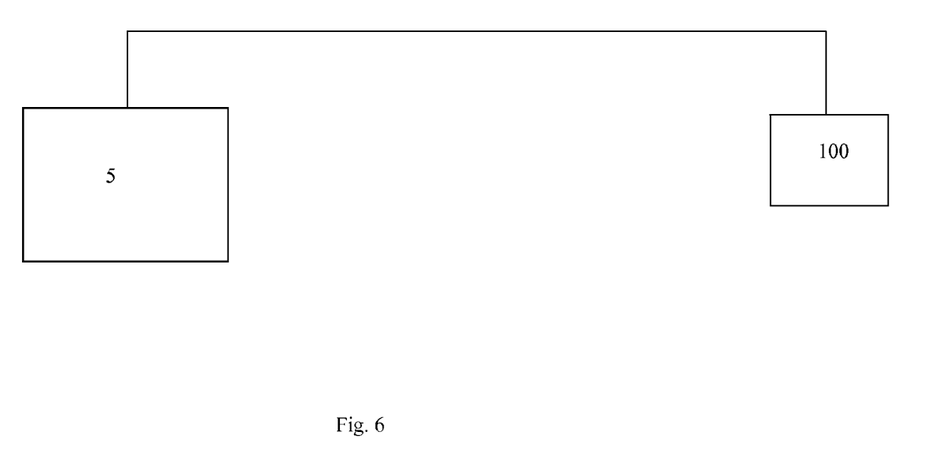
FIG. 6 shows a light source rigidly connected to a component of a microlithography projection exposure installation.

FIG. 6 shows an embodiment in which light source 5 is rigidly connected to an optical component 100 of the microlithography projection exposure installation.

Generally speaking, if the relative position of two components in the EUV beam path of the projection exposure installation is to be adjusted, the bundle-sensitive optical component should be rigidly connected to one of the two components which are to be adjusted and the reflector should be rigidly connected to the other component which is to be adjusted.

A plurality of adjusting devices 1 can be used in the projection exposure installation in order to determine further relative positions and to improve the adjustment accuracy.

In cases where useful adjustment light 7 is guided along useful light beam 19, the correct position of intermediate focus aperture 17a can be adjusted at the same time. To achieve this, a variable size aperture which is representative of the position of the intermediate focus aperture can be reduced during adjustment until the intermediate focus aperture can be aligned relative to useful light beam 19 by maximizing the transmission of light.

Reflector 13 can also be mounted on a different component of the illuminating optics 3 if its position relative to radiation source 2 is to be adjusted. Useful adjustment light 7 can be guided parallel to the main beam of EUV radiation 17 as far as the component of the illuminating optics which is to be adjusted, with retroreflection not taking place until the component of illuminating optics 3 which is to be adjusted.

Figure 4:
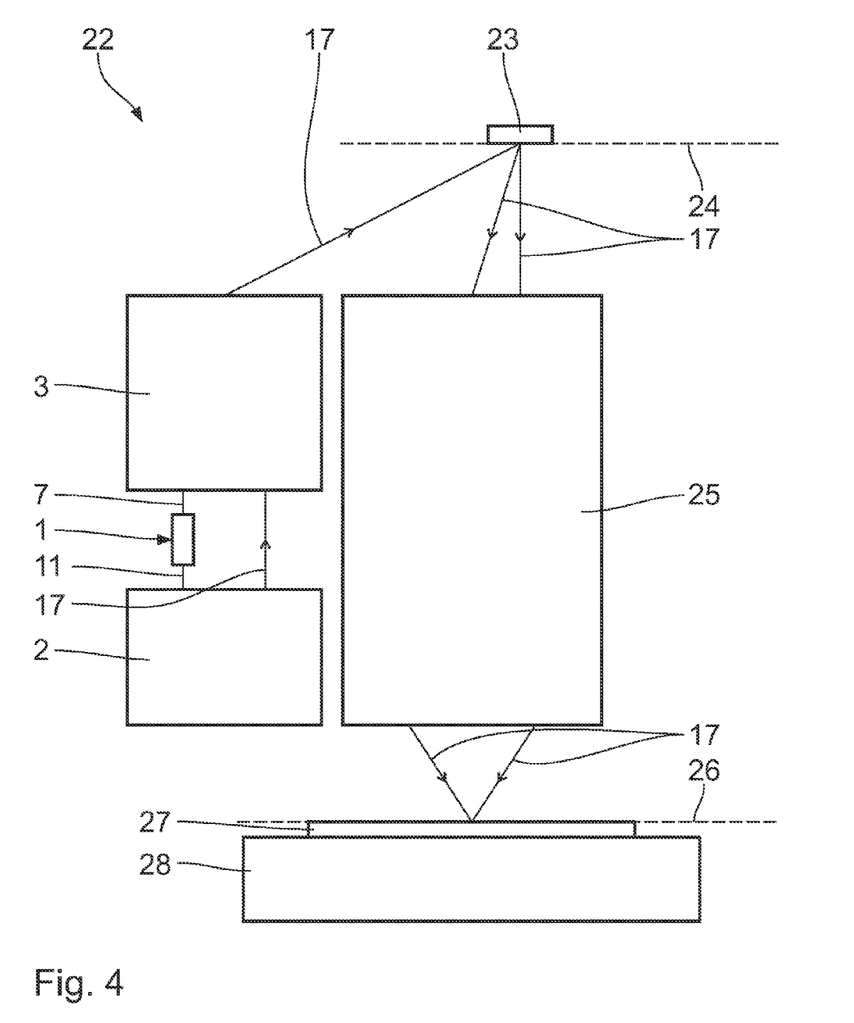
FIG. 4 shows a schematic view of the microlithography projection exposure installation with the adjusting device.

FIG. 4 schematically shows adjusting device 1 as a component of microlithography projection exposure installation 22. EUV light 17 generated by radiation source 2 is shaped by the illuminating optics 3 and guided towards a reticle 23. In the embodiment according to FIG. 4, reticle 23 is designed as a reflective reticle. EUV light 17 illuminates an illumination field in a defined manner in object plane 24 in which reticle 23 is located. A projection optical system 25 is used to map this illumination field onto an image field in an image plane 26. A wafer 27 is placed on a wafer holder 28 in the image plane.

Figure 2:
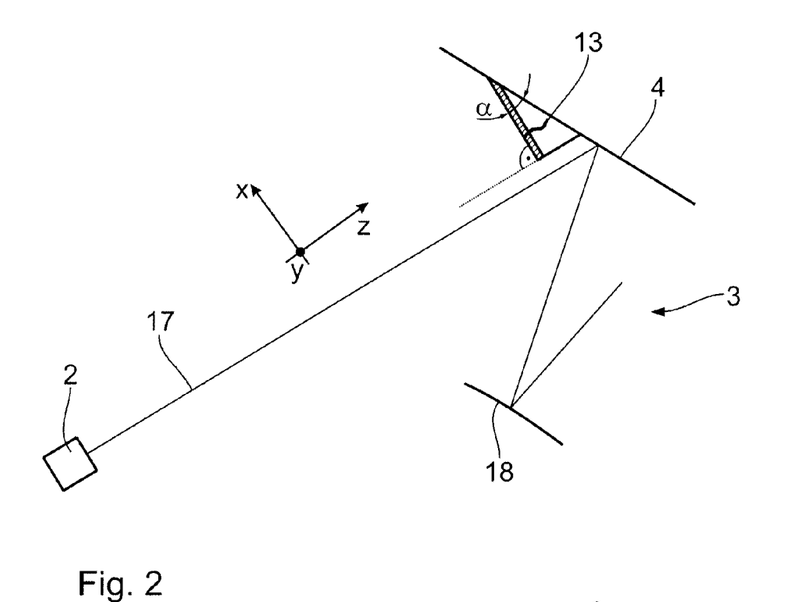
FIG. 2 shows a schematic view of a reflector of the adjusting device according to FIG. 1 together with illumination components of the projection exposure installation.
Figure 3:
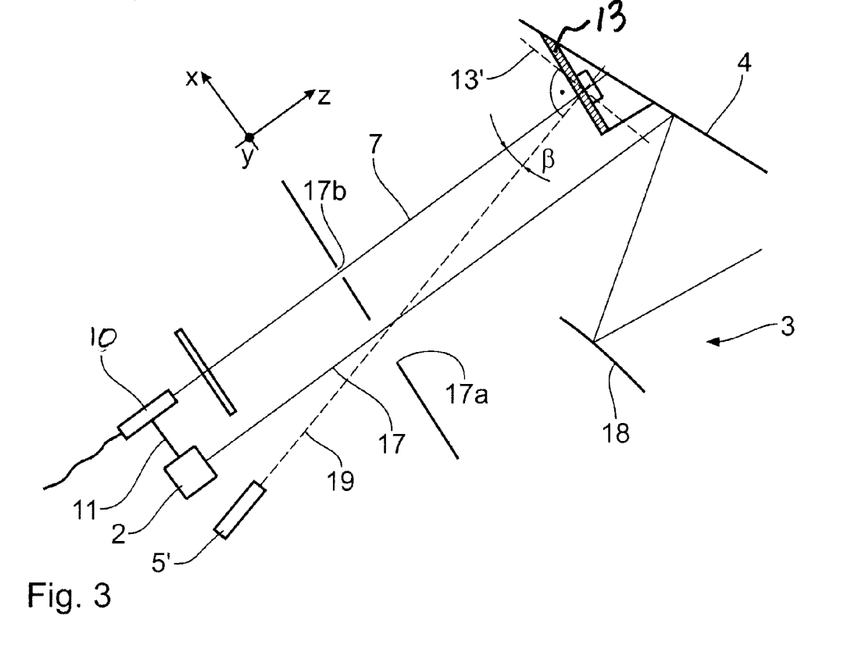
FIG. 3 shows the components according to FIG. 2 together with the reflector side components of the adjusting device and an optional adjustment light source.

Adjusting device 1 is connected to a component of radiation source 2 by the holder 11 and emits the useful adjustment light 7 towards the illuminating optics 3, namely to reflector 13, which is located there as described above in relation to FIG. 1.s1 to 3.

The component of radiation source 2 to which adjusting device 1 is connected by holder 11, and optical component 4 of the illuminating optics 3 may be driven and displaceable relative to each other. This displacement mechanism can, together with detectors 13b, 15, be a component of a feedback control system which, by analyzing the signals from detectors 13b, 15, actively readjusts a setpoint value of detectors 13b, 15 by driving the displacement mechanism and hence readjusts radiation source 2 to a desired relative position with respect to illuminating optics 3.

Laser light source 5, reflector 13 and the optical components which bring about two-way propagation of useful adjustment light 7 can be regarded as integral parts of an autocollimating device of adjusting device 1. It is evident that such an autocollimating device can be constructed in another manner which is familiar to persons skilled in the art. In principle, such an autocollimating device involves an adjustment light source, a reflector and optical components of a beam guide for the useful adjustment light, which ensure that in its adjusted state, the useful adjustment light impinges absolutely perpendicularly on the reflector and is therefore reflected back on itself. Equivalent autocollimating devices are, for instance, familiar in connection with methods for determining the focal length of lenses or lens systems.

What is claimed is:

1. An adjusting device, comprising:
an autocollimating device comprising:
   a light source configured to emit adjustment light; and
   a reflector,
wherein:
   the light source is configured to be rigidly connected to a first optical component of a microlithography projection exposure installation;
   the reflector is configured to be rigidly connected to a second optical component of the microlithography projection exposure installation;
   the first optical component is different from the second optical component;
   the adjusting device is configured to align the first optical component to the second optical component; and
   during use, the autocollimating device measures an angle between the adjustment light impinging on the reflector and the adjustment light reflected from the reflector to an accuracy better than 40 µrad.

2. A system, comprising:
an adjusting device according to claim 1,
wherein the system is an illumination system.

3. An installation, comprising:
an illumination system comprising the adjusting device of claim 1, wherein the installation is a projection exposure.

4. An adjusting device, comprising:
a laser light source configured to emit light along an optical path;
a beam-splitter located downstream from the laser light source, the beam-splitter being configured to let through a first portion of light emitted from the laser light source along the optical path;
a reflector capable of being rigidly connected to one of a reference component of illuminating optics of a microlithography projection exposure installation and a radiation source of the microlithography projection exposure installation so that, when a position of the reference component relative to the radiation source of the microlithography projection exposure installation coincides with a desired position, the portion of light is reflected back on itself, the radiation source being different from the laser light source; and
a bundle-sensitive component sensitive to a direction and a position of the portion of light in the optical path between the bundle-sensitive component and the reflector, the bundle-sensitive component capable of being rigidly mounted relative to the other of the radiation source and the reference component.

5. The adjusting device according to claim 4, further comprising a light sensor located downstream from the beam-splitter in the optical path for the portion of light reflected back by the reflector.

6. The adjusting device according to claim 5, further comprising a λ/4 plate in the optical path between the bundle-sensitive component and the reflector, wherein the beam-splitter is a polarizing beam-splitter arranged so that the portion of light is a first polarization component of the light, the light sensor is downstream from the polarizing beam-splitter in the optical path for a second polarization component of the light, and the second polarization is perpendicular to the first polarization component.

7. The adjusting device according to claim 6, wherein the bundle-sensitive component comprises an optical fiber in the optical path between the beam-splitter and the reflector, and the bundle-sensitive component is capable of being rigidly mounted on the radiation source or the reference component.

8. The adjusting device according to claim 7, wherein the λ/4 plate is located in the optical path between a reflector side end of the fiber and the reflector.

9. An adjusting device according to claim 7, wherein the optical fiber is a polarization maintaining fiber.

10. The adjusting device according to claim 5, wherein the light sensor is a photodiode.

11. The adjusting device according to claim 4, further comprising a position sensitive detector mounted on the reflector.

12. The adjusting device according to claim 4, wherein the reflector can be mounted so that the portion of light travels through the illuminating optics parallel to a desired path of a main beam of light from the radiation source.

13. The adjusting device according to claim 4, wherein the reflector can be mounted so that the portion of light travels through an intermediate focus of the desired path of a main beam of illumination light from the radiation source.

14. A system, comprising:
an adjusting device according to claim 4,
wherein the system is an illumination system.

15. An installation, comprising:
an illumination system comprising the adjusting device of claim 4, wherein the installation is a projection exposure.

16. A device, comprising:
a light source configured to emit light;
a coupler configured to receive the light emitted by the light source;
a reflector optically coupled to the light source and configured to reflect the light emitted by the light source;
a sensor configured to sense the light emitted by the light source and reflected by the reflector,
wherein:
   the coupler is connected to a first element;
   the first element is one of a first optical component of a microlithography projection exposure installation, and a radiation source configured to emit radiation;
   the reflector is connected to a second element;

the second element is the other of the first optical component of the microlithography projection exposure installation, and the radiation source configured to emit the radiation;

the first element is different from the second element;

during use, the device is configured to align the first and second elements;

the device is an autocollimating device; and during use, the autocollimating device measures an angle between the light impinging on the reflector and the light reflected from the reflector to an accuracy better than 40 μrad.

17. The device of claim 16, further comprising a beamsplitter between the light source and the reflector along an optical path of the light emitted by the light source.

18. The device of claim 17, wherein the beam splitter is configured to pass a first portion of light emitted by the light source and substantially block a second portion of light emitted by the light source.

19. The device of claim 18, wherein the first portion of light has a first polarization, and the second portion of light has a second polarization different from the first polarization.

20. The device of claim 16, wherein the reflector is capable of being rigidly connected to a reference component of illuminating optics of the microlithography projection exposure installation or a radiation source of the microlithography projection exposure installation so that, when a position of the reference component relative to the radiation source of the microlithography projection exposure installation coincides with a desired position, the portion of light is reflected back on itself, the radiation source being different from the laser light source.

21. The device of claim 16, further comprising a bundle-sensitive component between the light source and the reflector along an optical path of the light emitted by the light source, wherein the bundle-sensitive component is sensitive to a direction and a position of the light emitted by the light source, and the bundle-sensitive component is capable of being rigidly mounted relative to the reference component or a radiation source of the microlithography projection exposure installation.

* * * * *

UNITED STATES PATENT AND TRADEMARK OFFICE
CERTIFICATE OF CORRECTION

PATENT NO. : 8,179,519 B2  Page 1 of 1
APPLICATION NO. : 12/046836
DATED : May 15, 2012
INVENTOR(S) : Ralf Stuetzle It is certified that error appears in the above-identified patent and that said Letters Patent is hereby corrected as shown below:

Column 9,
Line 3, delete "FIG. 1.s1 to 3." And insert --FIGS. 1 to 3.--

Signed and Sealed this
Tenth Day of July, 2012

David J. Kappos
*Director of the United States Patent and Trademark Office*